(12) United States Patent
Tober et al.

(10) Patent No.: US 6,429,369 B1
(45) Date of Patent: Aug. 6, 2002

(54) THIN-FILM SOLAR CELLS ON THE BASIS OF IB-IIIA-VIA COMPOUND SEMICONDUCTORS AND METHOD FOR MANUFACTURING SAME

(75) Inventors: Olaf Tober, Berlin; Jürgen Penndorf, Hohenwalde; Michael Winkler; Klaus Jacobs, both of Berlin; Thomas Koschack, Wiesenau, all of (DE)

(73) Assignee: IST-Institut fur Solartechnologies GmbH (DE)

(*) Notice: Subject to any disclaimer, the term of this patent is extended or adjusted under 35 U.S.C. 154(b) by 0 days.

(21) Appl. No.: 09/567,932

(22) Filed: May 10, 2000

(30) Foreign Application Priority Data

May 10, 1999 (DE) .......................... 199 21 515

(51) Int. Cl.⁷ .................. H01L 31/0264; H01L 31/0272
(52) U.S. Cl. .................. 136/265; 136/252; 136/262; 136/264; 136/256; 257/461; 257/431; 257/464; 438/95; 438/98
(58) Field of Search ................ 136/252, 262, 136/264, 265, 256; 257/461, 431, 464; 438/95, 98

(56) References Cited

U.S. PATENT DOCUMENTS

| 5,045,409 A | * | 9/1991 | Eberspacher et al. | ....... 428/620 |
| 5,141,564 A | | 8/1992 | Chen et al. | .......... 136/258 |
| 5,477,088 A | * | 12/1995 | Rockett et al. | .......... 136/265 |
| 6,117,703 A | * | 9/2000 | Penndorf | ............. 438/63 |

FOREIGN PATENT DOCUMENTS

| DE | 42 25 385 C2 | 2/1994 |
| DE | 19634580 C2 | 7/1998 |
| EP | 0 360 403 A2 | 3/1990 |
| EP | 0 574 716 B1 | 12/1993 |
| EP | 0 798 786 A2 | 10/1997 |
| EP | 0881695 A2 * | 12/1998 |
| EP | 0 881 695 A2 | 12/1998 |
| WO | WO 95/09441 | 4/1995 |

OTHER PUBLICATIONS

Winkler et al, Thin Solid Films, vols. 361–362, pp. 273–277, (2000).*
Konovalov et al, Solar Energy Materials & Solar Cells, vol. 67, pp. 49–58, (2001).*
Penndorf et al. "CuInS2 thin film formation on a Cu tape substrate for photovoltaic applications" Solar Energy Materials and Solar Cells 53 (1998) 285–298.

* cited by examiner

Primary Examiner—Alan Diamond
(74) Attorney, Agent, or Firm—Gifford, Krass, Groh, Sprinkle, Anderson & Citkowski, P.C.

(57) ABSTRACT

The invention relates to a thin-film solar cell on the basis of IB-IIIA-VIA compound semiconductors and a method for producing such a solar cell. Between the polycrystalline IB-IIIA-VIA absorber layer of the p-type conductivity and the carrier film serving as a substrate, a back electrode of intermetallic phases of the same IB- and IIIA-metals are located which are deposited for the generation of the absorber layer. The absorber layer and the back electrode are produced in such a way that the precursor consisting of IB-IIIA-metals is vertically only incompletely converted into the photovoltaicly active absorber material from the side opposite to the carrier film by reaction with chalcogen such that intermetallic phases of the IB- and IIIA-metals are directly located on the carrier film, which metals serve as back electrode of the solar cell structure.

17 Claims, 2 Drawing Sheets

500 nm

THIN-FILM SOLAR CELLS ON THE BASIS OF IB-IIIA-VIA COMPOUND SEMICONDUCTORS AND METHOD FOR MANUFACTURING SAME

The invention relates to a thin-film solar cell on the basis of the IB-IIIA-VIA semiconductors, the back electrode of which consists of intermetallic phases of the same metals which are used for manufacturing the polycrystalline absorbing layer of the p-type conductivity. The invention further relates to a method for manufacturing such a solar cell.

BACKGROUND OF THE INVENTION

It is one of the main aims of the development of photovoltaic modules to substantially reduce the production costs of solar electricity for terrestrial applications. For extraterrestrial applications the reduction in weight of the solar modules is together with the radiation resistance of the solar cells in the focus of the development.

Solar cells and modules on the basis of polycrystalline IB-IIIA-VIA compound semiconductors are suitable candidates in order to reach these aims. In recent years great progress could be reached particularly with compound semiconductors on the basis of copper, indium and gallium as well as selenium or sulfur as photoactive absorber material which are generally called CIS or CIGS.

DESCRIPTION OF THE PRIOR ART

The cell structure known from U.S. Pat. No. 5,141,564 comprising a substrate made of glass, a back electrode made of molybdenum, a polycrystalline absorber layer having a thickness of 1 to 5 µm of $CuInSe_2$ or $CuIn(Se,S)_2$ of the p-type conductivity, a thin-film cadmium sulfide-window layer and a transparent front electrode of the n-type conductivity, forms the basis of most methods for manufacturing these polycrystalline thin-film solar cells. Instead on molybdenum-covered glass substrates the polycrystalline absorber layers may also be deposited on flexible tape-like substrates like tapes made of molybdenum or metallic tapes covered by molybdenum as described in German Patent DE 42 25 385 C2 and in European Patent Application EP 0,574,716 A1.

All these arrangements comprise a back electrode made of molybdenum. The low adherence of the polycrystalline absorber layers on molybdenum however leads to peeling of the layers on glass substrates and flaking on flexible tapes and hindered the development of flexible CIS-solar cells so long to a great extent. In order to improve the adherence of CIS-absorber layers, intermediate layers made of titanium, tantalum, chromium or titanium nitride between the molybdenum-back electrode and the absorber layer are proposed in WO 95/09441 A1. In EP 0,360,403 A2 a copper-indium-diselenide solar cell having a gallium containing intermediate layer between the CIS-absorber and the substrate made of molybdenum is proposed. In EP 0,798,786 A2 a solar cell having a chalcopyrite-absorber layer is proposed according to which a thin intermediate layer is arranged between the back electrode made of molybdenum and the absorber layer, said intermediate layer comprising zinc.

It is disadvantageous with respect to all these arrangements that an additional component is to be introduced and that, therefore, an additional technological step for the deposition of these layers is necessary.

In German Patent DE 196 34 580 C2 a method is proposed according to which the CIS-absorber layer is directly deposited onto a copper tape. According to this method the CIS-absorber layer is closely or firmly intergrown with the copper tape such that no peeling or flaking takes place here. In Solar Energy Materials and Solar Cells 53 (1998) pp. 285–298 a thin layer of intermetallic copper-indium phases is indicated between the copper tape and the polycrystalline absorber layer. The absorber layer produced according to this method is of the n-type of conductivity. Since the mobility of the minority carriers is smaller by one order of magnitude in n-type conductivity chalcopyrites than in p-type conductivity chalcopyrites, more reduced efficiencies are to be expected with respect to this arrangement if compared to an arrangement comprising a p-type absorber layer and a n-type conductivity collector layer. Moreover, this method is affected in a detrimental way by the reduced mechanical stability of copper such that relatively thick copper tapes are to be used. Since according to this method the copper tape simultaneously forms the copper source for the absorbing layer, very pure copper tapes are to be used such that the costs of the solar cell are unnecessarily increased.

SUMMARY OF THE INVENTION

It is an object of the present invention to provide a solar cell comprising a p-type conductivity absorber layer on the basis of IB-IIIA-VIA compound semiconductors which firmly adheres on any cost-effective carrier film. It is a further object of the present invention to provide a solar cell of the above described type which is flexible and which may be produced at a rather low expenditures. It is still another object of the present invention to provide a solar cell of the above described type having a rather low weight. It is another object of the present invention to provide a method for manufacturing such a solar cell.

These and other objects are solved by a thin-film solar cell on the basis of IB-IIIA-VIA compound semiconductors comprising a back electrode between the polycrystalline IB-IIIA-VIA absorber layer of the p-type of conductivity and a carrier film used as a substrate, said back electrode being made of intermetallic phases of the same IB- and IIIA-metals which are deposited for the generation of the absorber layer.

These and other objects are also solved by a method for manufacturing a thin-film solar cell having a back electrode between the absorber layer and the carrier film, said method characterized in that the IB- and IIIA-metals are deposited on the carrier film, the metals on the side opposite to the carrier film are vertically only incompletely converted by reaction with chalcogen into the photovoltaicly active absorber material such that the intermetallic phases of the IB- and IIIA-metals are directly located on the carrier film, said IB- and IIIA-metals serving as back electrode of the solar cell structure, a buffer layer is deposited, and a transparent conductive front electrode is deposited.

Advantageous embodiments of the present invention are described in the respective sub-claims.

It is the basic idea of the present invention that the back electrode of the solar cell is made of intermetallic phases of the same IB- and IIIA-metals which are used for the formation of the polycrystalline absorber layer. These intermetallic phases simultaneously serve for the coupling between the absorber layer and the flexible carrier film. Thus, a separate deposition of a molybdenum-layer as back electrode and the deposition of intermediate layers for the improvement of the adherence of the absorber layer is not necessary.

With respect to the good adherence of the absorber layer cost-effective, very thin, mechanically rigid metal films may be used as substrate. On these substrates flexible solar cells can be produced by continuous roll-to-roll processes. In a first step the IB- and IIIA-metals are deposited in a continuous roll-to-roll process. In a second continuous roll-to-roll process the carrier film covered by the precursor is chalcogenised in a narrow-slit reactor. The process is performed such that the IB-IIIA metallic precursor is only incompletely converted into the ternary polycrystalline p-type absorber layer such that intermetallic phases of the IB- and IIIA-metals are directly located on the carrier film which metals serve as back electrode of the solar cell structure. Because of the short reaction time during the chalcogenising process and the low heat capacity of the carrier film ternary polycrystalline absorber layers may thus be deposited on thin carrier films in a continuous roll-to-roll process in an effective manner. The polycrystalline absorber layer is closely intergrown with the back electrode such that neither peeling nor flaking will occur on the flexible metal films. The deposition of a buffer layer and of a transparent front electrode in a continuous roll-to-roll process completes the process for producing these flexible thin-film solar cells.

DESCRIPTION OF THE DRAWINGS

A better understanding of the present invention will be reached by reference to the following detailed description when read in conjunction with the accompanying drawings in which.

DETAILED DESCRIPTION OF TWO PREFERRED EMBODIMENTS OF THE PRESENT INVENTION

Figure 1:
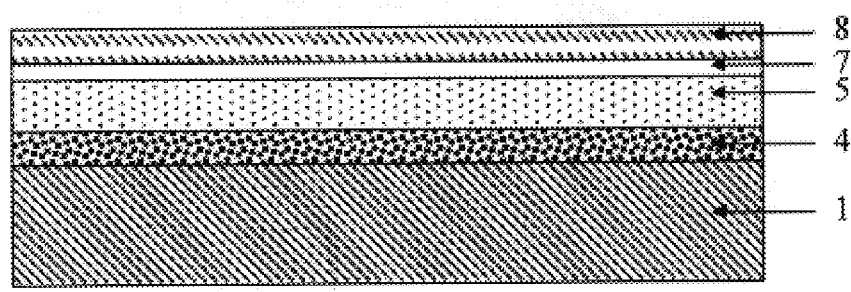
FIG. 1 is a schematic view of the structure of a solar cell according to the present invention.
Figure 2:
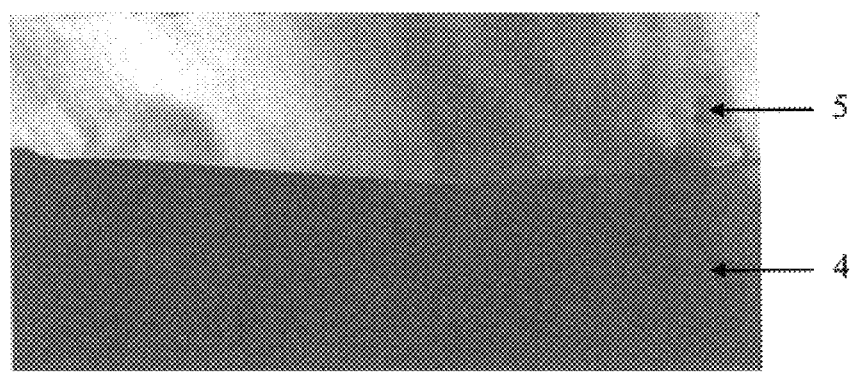
FIG. 2 is a schematic view of the polycrystalline absorber layer being closely inter-grown with the back electrode.
Figure 3:
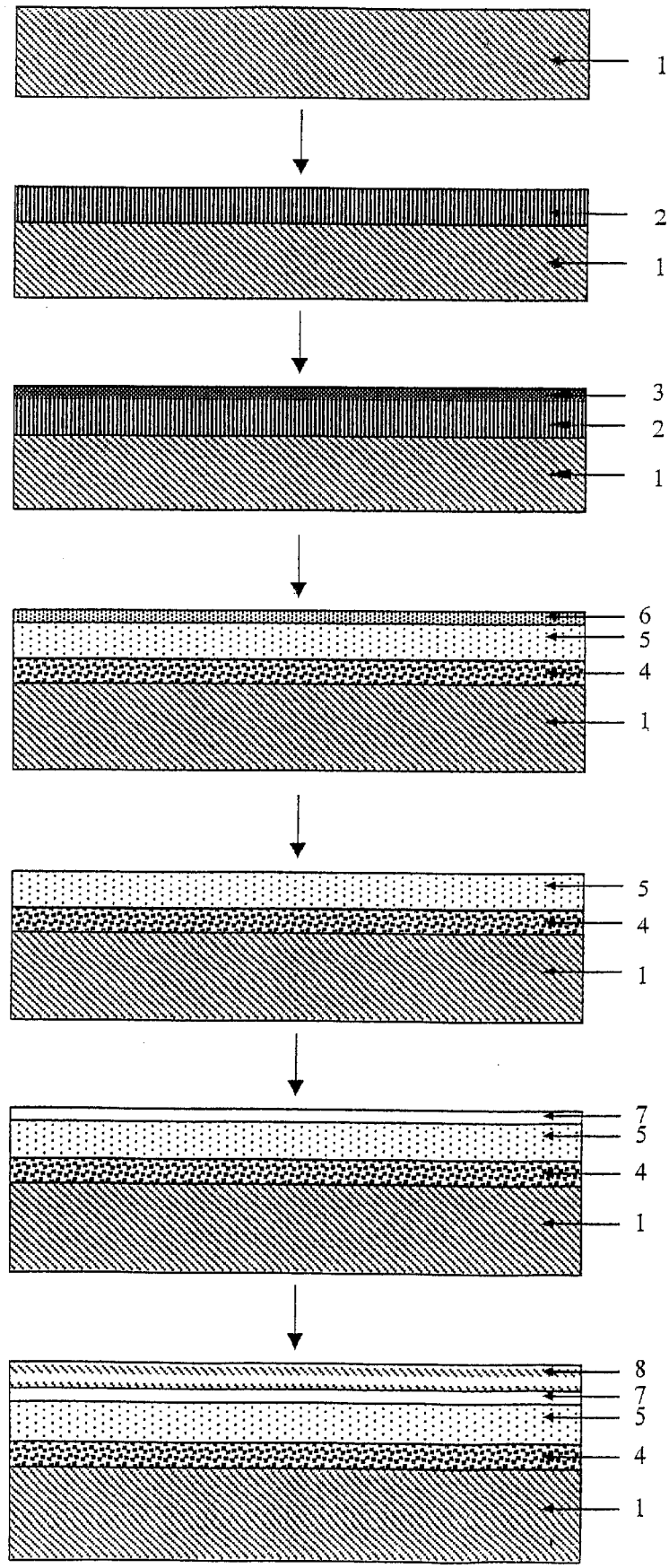
FIG. 3 is a schematic view of the intermediate products during the production of the flexible solar cell.

A stainless steel film typically having a thickness of 10 $\mu$m to 30 $\mu$m normally serves as carrier film 1. The stainless steel film may further be covered by other metals or oxides. On the carrier film 1 there is located the back electrode 4 having a thickness of 1 $\mu$m to 5 $\mu$m. The back electrode 4 preferably consists of the intermetallic phase $Cu_7In_3$. The polycrystalline absorber layer (PAS) 5 of the p-type conductivity—preferably consisting of the phase $CuInS_2$— is arranged thereabove. The absorber layer typically has a thickness of 1 $\mu$m to 3 $\mu$m. The PAS 5 is closely intergrown with the back electrode 4 such that there will not occur any flaking. A thin buffer layer 7, preferably made of CdS, is arranged on the polycrystalline absorber layer 5. This buffer layer 7 has a thickness of 10 nm to 50 nm. A transparent bleeder electrode 8, preferably made of externally doped zinc oxide, is arranged on the buffer layer 7.

This solar cell has a thickness of only about 20 $\mu$m to 40 $\mu$m and can therefore be produced very efficiently with respect to material consumption. Because of its low film thickness the solar cell has a very low weight and is perfectly suited for extraterrestrial applications.

In order to produce such solar cells the metals copper and indium are electrolytically deposited one after the other preferably in a roll-to-roll process on the flexible stainless steel film 1. This method is very material-efficient and may relatively simply performed with respect to the installation technique. It is also possible to deposit the metal precursors by sputtering processes and vacuum evaporation processes or combinations thereof. The copper layer 2 typically has a thickness of 1 $\mu$m to 5 $\mu$m. The thickness of the indium layer 3 is typically 0.5 $\mu$m to 2 $\mu$m.

Thereafter, the carrier film 1 covered by the Cu—In precursor is chalcogenised in a narrow-slit reactor by a roll-to-roll process for some seconds. The precursor is heated on 450° C. to 600° C. under an inert gas atmosphere preferably in the range of milliseconds. Indium is melting, copper is dissolved in the melting according to the phase diagram. In the following, the precursor is chalcogenised in a sulfur or selenium containing reaction gas, preferably in a sulfur containing nitrogen-carrier gas. According to this process the polycrystalline absorber layer 5 of the p-type conductivity is formed by a chemical reaction of the gaseous sulfur with the liquid Cu—In precursor. The chalcogenizing process takes preferably 1 second to 10 seconds. According to this process control the Cu—In precursor is only incompletely converted into the polycrystalline absorber layer 5. After the chalcogenizing process the film 1 comprising the absorber layer 5 is annealed under an inert gas atmosphere at a temperature of preferably 500° C. to 600° C. This annealing step typically takes 10 s to 60 s. During this step the residual precursor solidifies under formation of intermetallic Cu—In phases, preferably the $Cu_7In_3$ phase which forms the back electrode 4 of the solar cell and which simultaneously closely intergrows with the absorber layer 5. The annealing determines the crystalline structure and the electronic properties of the polycrystalline absorber layer 5. After annealing the film is cooled to ambient temperature under inert gas atmosphere in a range of seconds.

The whole process "heating, chalcogenizing, annealing, cooling" typically takes between 15 s and 70 s. It is formed the structure "stainless steel film 1, Cu—In back electrode 4, polycrystalline p-CIS-absorber layer 5".

Binary Cu-chalcogen phases 6 may have been formed on the surface of the CIS-absorber layer 5 which phases are removed by etching during an intermediate step in a roll-to-roll process.

A n-type layer of cadmium sulfide is wet-chemically deposited on the polycrystalline absorber layer 5 of the p-type conductivity in a roll-to-roll process. The deposition of thin layers of indium oxide, indium hydroxide or zinc sulfide is also possible. In a last step the transparent front electrode (TCO) is applied in a roll-to-roll process, the front electrode typically consisting of a ZnO-layer having a thickness of 1 $\mu$m to 2 $\mu$m and being deposited by a sputtering process. Other conductive oxides may be used here.

What is claimed is:

1. A thin-film solar cell on the basis of the IB-IIIA-VIA semiconductors, said solar cell comprising:
    a polycrystalline IB-IIIA-VIA absorber layer, said absorber layer having p-type conductivity;
    a carrier substrate; and
    a back electrode deposed between said carrier substrate and said absorber layer, said back electrode consisting of binary intermetallic phases of the same IB- and IIIA-metals used for generation of said absorber layer.

2. A thin-film solar cell according to claim 10, characterized in that the carrier substrate is a flexible metallic film.

3. A thin-film solar cell according to claim 2, characterized in that the flexible metallic film has a thickness between 15 $\mu$m and 100 $\mu$m.

4. A thin-film solar cell according to claim 1, wherein the back electrode consists of binary intermetallic phases of Cu and In.

5. A thin-film solar cell according to claim 2, characterized in that the carrier film is a stainless steel film.

6. A method for producing the thin film solar cell according to claim 1, comprising a back electrode between a photovoltaicly active absorber layer and a carrier substrate comprising the steps of depositing the IB- and IIIA-metals on the carrier substrate to form a layer of IB- and IIIA-metals, said layer having a first side and a second side, chalcogenizing the IB- and IIIA metals such that said metals on said second side are converted into the photovoltaicly active absorber material and underlying binary intermetallic phases of the IB- and IIIA-metals are provided on said first side which is directly located on the carrier substrate, said IB- and IIIA-metals serving as the back electrode of the solar cell structure, depositing a buffer layer, and depositing a transparent conductive front electrode.

7. A method according to claim 6, characterized in that said chalcogenizing is a roll-to-roll process.

8. A method according to claim 6, wherein the back electrode consists of Cu—In phases and the absorber layer consists of the elements Cu, In, and S.

9. A method according to claim 6, characterized in that the carrier substrate is a metallic film.

10. A thin-film solar cell according to claim 2, wherein the back electrode has a thickness between 1 $\mu$m and 5 $\mu$m.

11. A thin-film solar cell according to claim 1 further comprising a buffer layer.

12. A thin-film solar cell according to claim 11, wherein the buffer layer has a thickness between 10 nm and 50 nm.

13. A thin-film solar cell according to claim 12, wherein said buffer layer comprises CdS.

14. A thin-film solar cell according to claim 1 further comprising a transparent bleeder electrode.

15. A thin-film solar cell according to claim 14, wherein said transparent bleeder electrode comprises externally doped zinc oxide.

16. A thin-film solar cell comprising:

a polycrystalline IB-IIIA-VIA absorber layer, said absorber layer having p-type conductivity;

a carrier substrate;

a back electrode deposed between said carrier substrate and said absorber layer, said back electrode consisting of binary intermetallic phases of the same IB- and IIIA-metals used for generation of said absorber layer;

a transparent bleeder electrode; and a buffer layer disposed between said transparent bleeder electrode and said absorber layer.

17. A method for producing a thin-film solar cell on the basis of the IB-IIIA-VIA semiconductors, said solar cell comprising a back electrode between an absorber layer and a carrier substrate, comprising the steps of:

depositing IB- and IIIA-metals on said carrier substrate to form a layer of metals, said layer having a first side contacting said carrier substrate and a second side opposite said first side;

chalcogenizing said IB- and IIIA metals, such that the metals located on said second side are incompletely converted into said absorber layer and IB-IIIA binary intermetallic phases are located on said first side, said binary intermetallic phases serving as the back electrode of the solar cell structure;

depositing a buffer layer, and depositing a transparent conductive front electrode.

* * * * *